US010607711B2

(12) United States Patent
Li et al.

(10) Patent No.: US 10,607,711 B2
(45) Date of Patent: Mar. 31, 2020

(54) CURRENT SAMPLE-AND-HOLD CIRCUIT AND SENSOR

(71) Applicant: SHENZHEN GOODIX TECHOLOGY CO., LTD., Shenzhen, Guangdong (CN)

(72) Inventors: Jingshan Li, Guangdong (CN); Mengwen Zhang, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/166,699

(22) Filed: Oct. 22, 2018

(65) Prior Publication Data

US 2019/0189235 A1    Jun. 20, 2019

Related U.S. Application Data

(63) Continuation of application No. PCT/CN2017/116831, filed on Dec. 18, 2017.

(51) Int. Cl.
*G11C 27/02* (2006.01)
*G01R 27/26* (2006.01)
(Continued)

(52) U.S. Cl.
CPC ............ *G11C 27/028* (2013.01); *G01R 27/26* (2013.01); *G11C 7/02* (2013.01); *G11C 27/026* (2013.01);
(Continued)

(58) Field of Classification Search
CPC .................. G11C 27/028; G11C 27/026
(Continued)

(56) References Cited

U.S. PATENT DOCUMENTS 5,852,374 A * 12/1998 Frazier ................... B82Y 10/00
327/77
2001/0009403 A1* 7/2001 Huang ................... H03H 11/04
341/143
(Continued)

FOREIGN PATENT DOCUMENTS

CN        2012159954 Y     4/2009
CN        102353395 A      2/2012
(Continued)

OTHER PUBLICATIONS

Extended European Search Report for European Application No. 17905908.4 dated May 13, 2019.

*Primary Examiner* — Tomi Skibinski
(74) *Attorney, Agent, or Firm* — Heslin Rothenberg Farley & Mesisti P.C.

(57) ABSTRACT

A current sample-and-hold circuit and a sensor, are provided. The current sample-and-hold circuit is used for offsetting a background photocurrent of a photodiode, and includes a capacitor and a first transconductance amplifier which has adjustable transconductance and outputs a sampled current to the photodiode to offset the background photocurrent of the photodiode. One end of the capacitor is connected with a power supply, the other end of the capacitor is connected with one end of the first transconductance amplifier; and the other end of the first transconductance amplifier is connected with the photodiode to output the sampled current to the photodiode. When the background photocurrent of the photodiode is increased, a change of a voltage of the capacitor within a large range can be avoided by increasing the transconductance of the first transconductance amplifier, so that the current sample-and-hold circuit can offset a larger background photocurrent.

10 Claims, 4 Drawing Sheets

(51) Int. Cl.
  *H01L 27/02* (2006.01)
  *H03F 1/08* (2006.01)
  *G11C 7/02* (2006.01)

(52) U.S. Cl.
  CPC ......... *H01L 27/0251* (2013.01); *H03F 1/083* (2013.01); *H03F 1/086* (2013.01); *H03F 2200/129* (2013.01); *H03F 2200/156* (2013.01); *H03F 2200/375* (2013.01); *H03F 2200/45* (2013.01)

(58) Field of Classification Search
  USPC ..................................................... 327/91, 94
  See application file for complete search history.

(56) References Cited

U.S. PATENT DOCUMENTS

| | | | |
|---|---|---|---|
| 2004/0196085 A1* | 10/2004 | Shen | H03H 15/00 327/277 |
| 2009/0167364 A1 | 7/2009 | Bramante et al. | |
| 2014/0028290 A1* | 1/2014 | Petrie | G01R 15/207 324/144 |
| 2017/0031008 A1* | 2/2017 | Davidovic | G01J 1/4204 |

FOREIGN PATENT DOCUMENTS

| | | |
|---|---|---|
| CN | 103359445 A | 10/2013 |
| CN | 106535753 A | 3/2017 |
| CN | 106599754 A | 4/2017 |
| EP | 0046396 A1 | 2/1982 |
| EP | 3255789 A1 | 12/2017 |

\* cited by examiner

CURRENT SAMPLE-AND-HOLD CIRCUIT AND SENSOR

CROSS-REFERENCE TO RELATED APPLICATIONS

The present disclosure is a continuation of International Application No. PCT/CN2017/116831 filed on Dec. 18, 2017, which application is hereby incorporated by reference herein, in its entirety.

TECHNICAL FIELD

This disclosure relates to current sample-and-hold technologies, and particularly, to a current sample-and-hold circuit and a sensor.

BACKGROUND

In an existing heart rate detection circuit, a photodiode is generally used for receiving reflected light from human body, and then an integrator is utilized to convert an induced current of the photodiode into a voltage signal for subsequent processing. However, due to presence of ambient light, the integrator is usually saturated, which affects normal operation of the circuit. Therefore, a current sample-and-hold circuit needs to be introduced to offset a background photocurrent (i.e., the induced current generated by the photodiode due to receiving the ambient light) in the photodiode so as to prevent saturation of the integrator.

A conventional current sample-and-hold circuit is as shown in FIG. 1. In FIG. 1, a current output circuit in the current sample-and-hold circuit is formed by a P-channel Metal Oxide Semiconductor (PMOS) transistor M of a fixed size. The PMOS transistor M, in a sampling stage, is used for sampling the background photocurrent of the photodiode PD (i.e., the induced current of a photodiode PD, namely, a current of a variable current source IBG in FIG. 1) and converting the sampled current into a voltage of a capacitor CSH. In an integrating stage, the PMOS transistor M is used for conveying the previous sampled current to the photodiode PD so as to offset the background photocurrent of the photodiode.

In a case where an area of the photodiode PD remains unchanged, the background photocurrent of the photodiode PD increases as light intensity increases. In a case where the light intensity remains unchanged, the background photocurrent of the photodiode PD is in turn proportional to the area of the photodiode PD. Therefore, when the area of the photodiode PD remains unchanged and the light intensity changes within a large range, or when the light intensity remains unchanged and the area of the photodiode PD changes within a large range, the background photocurrent of the photodiode PD can be changed within a large range. When the background photocurrent of the photodiode PD is very large, a gate-to-source voltage of the PMOS transistor M can also become very large, and the voltage of the capacitor CSH is equal to the gate-to-source voltage of the PMOS transistor M and also becomes larger. When the voltage of the capacitor CSH becomes large, a reversed bias voltage of the photodiode PD becomes small. When the reversed bias voltage decreases to a certain degree, a working efficiency of the photodiode PD is greatly reduced. Therefore, in existing technologies, in order to ensure the working efficiency of the photodiode PD, the voltage of the capacitor CSH is avoided to become very large, that is, the background photocurrent of the photodiode PD is avoided to become very large. That is to say, the conventional current sample-and-hole circuit can only be used for offsetting a relatively small background photocurrent.

SUMMARY

An objective of some embodiments in this disclosure is to provide a current sample-and-hold circuit and a sensor, which enable the current sample-and-hold circuit to offset a wider range of background photocurrent on the premise of avoiding a change of a voltage of a capacitor within a large range.

One embodiment of this disclosure provides a current sample-and-hold circuit, which is used for offsetting a background photocurrent of a photodiode and includes: a capacitor and a first transconductance amplifier which has adjustable transconductance and is used for outputting a sampled current to the photodiode to offset the background photocurrent of the photodiode; one end of the capacitor is connected with a power supply VDD, and the other end of the capacitor is connected with one end of the first transconductance amplifier; and the other end of the first transconductance amplifier is used for being connected with the photodiode so as to output the sampled current to the photodiode to offset the background photocurrent of the photodiode.

An embodiment of this disclosure further provides a sensor, the sensor is integrated with a photodiode and the above-mentioned current sample-and-hold circuit, and the other end of the first transconductance amplifier of the current sample-and-hold circuit is connected with the photodiode.

Compared to existing technologies, according to the embodiments of this disclosure, the first transconductance amplifier with the adjustable transconductance is arranged in the current sample-and-hold circuit, and according to a formula $I=g_{m1}*U$, it can be known that when the background photocurrent I of the photodiode increases (which is caused by a change of light intensity or caused by a change of an area of the photodiode), a change of a voltage U of the capacitor within a large range can be avoided by increasing the transconductance $g_{m1}$ of the first transconductance amplifier, so that the current sample-and-hold circuit can offset a larger background photocurrent.

In addition, the first transconductance amplifier includes a plurality of first electronic switches and a plurality of control switches for controlling the first electronic switches; the plurality of first electronic switches are connected between the power supply VDD and the photodiode, the plurality of first electronic switches are connected in series, and control ends of the plurality of first electronic switches are all connected with the other end of the capacitor; a junction between any two adjacent first electronic switches corresponds to one control switch, one end of each control switch is connected with the power supply VDD, and the other end of each control switch is connected with the corresponding junction. An implementation of the first transconductance amplifier is provided.

In addition, the current sample-and-hold circuit further includes a first sampling switch and a bias circuit for providing a bias voltage to the first transconductance amplifier; one end of the bias circuit is simultaneously connected with one end of the first transconductance amplifier and the other end of the capacitor through the first sampling switch; and the other end of the bias circuit is used for being connected with the photodiode. When the first sampling switch is closed, a closed-loop negative feedback is formed in the current sample-and-hold circuit.

In addition, the bias circuit includes a second electronic switch and a second transconductance amplifier; a first end of the second electronic switch is connected with the power supply VDD; a second end of the second electronic switch is connected with one end of the second transconductance amplifier; a control end of the second electronic switch, as one end of the bias circuit, is connected with the first sampling switch and a junction between the second end of the second electronic switch and one end of the second transconductance amplifier; and the other end of the second transconductance amplifier, as the other end of the bias circuit, is used for being connected with the photodiode. A structure of the bias circuit is provided.

In addition, the second transconductance amplifier includes a second sampling switch, an amplification circuit, a first current source, a third electronic switch and a fourth electronic switch; a first end of the third electronic switch is connected with the second end of the second electronic switch; a second end of the third electronic switch is grounded; a control end of the third electronic switch is connected with a junction between a second end of the first current source and a first end of the fourth electronic switch, and a control end of the fourth electronic switch; a first end of the first current source is connected with the power supply VDD; the first end of the fourth electronic switch is also connected with one end of the amplification circuit through the second sampling switch; a second end of the fourth electronic switch is grounded; and the other end of the amplification circuit is used for being connected with the photodiode. An implementation of the second transconductance amplifier is provided.

In addition, the amplification circuit includes a second current source and a fifth electronic switch; a first end of the fifth electronic switch, as one end of the amplification circuit, is respectively connected with the second current source and the second sampling switch; a second end of the fifth electronic switch is grounded; and a control end of the fifth electronic switch, as the other end of the amplification circuit, is used for being connected with the photodiode. The amplification circuit may be an amplification circuit in an integrator, which is beneficial for implementing multiplexing on the amplification circuit.

In addition, the first electronic switch is a PMOS transistor; a plurality of PMOS transistors are sequentially arranged along a direction towards the photodiode; in the plurality of PMOS transistors, a first PMOS transistor is a PMOS transistor the closest to the photodiode, and a last PMOS transistor is a PMOS transistor the furthest away from the photodiode; and a width-to-length ratio of the first PMOS transistor is equal to that of a second PMOS transistor, a width-to-length ratio of an $i^{th}$ PMOS transistor is twice of a width-to-length ratio of a $(i-1)^{th}$ PMOS transistor, and the i is greater than or equal to 3. An implementation of the first electronic switch is provided.

In addition, the second electronic switch is a PMOS transistor, and a width-to-length ratio of the second electronic switch is equal to that of the first PMOS transistor. A relationship between the first electronic switch and the second electronic switch is provided.

In addition, the current sample-and-hold circuit further includes a third sampling switch; and the third sampling switch is connected in parallel to the capacitor. Before sampling, charges on the capacitor can be released by closing the third sampling switch so as to ensure accuracy of sampling.

BRIEF DESCRIPTION OF THE DRAWINGS

One or more embodiments are exemplarily illustrated by figures in corresponding accompanying drawings, and these exemplary illustrations do not constitute a limitation to the embodiments. Elements with the same reference numeral in the accompanying drawings represent similar elements. Unless specified otherwise, the figures in the accompanying drawings do not constitute a proportional limitation.

DETAILED DESCRIPTION

In order to make objectives, technical solutions and advantages of this disclosure more apparent, some embodiments of this disclosure will be further illustrated in detail in combination with accompanying drawings and the embodiments. It should be understood that specific embodiments described herein merely are used for explaining this disclosure, and not intended to limit this disclosure.

Figure 1:
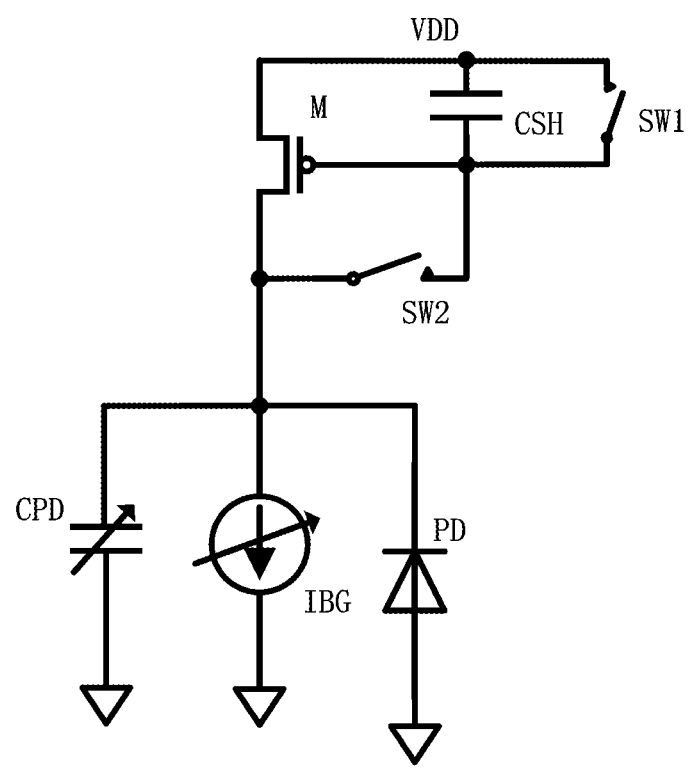
FIG. 1 is a structural schematic diagram of a current sample-and-hold circuit according to existing technologies.
Figure 2:
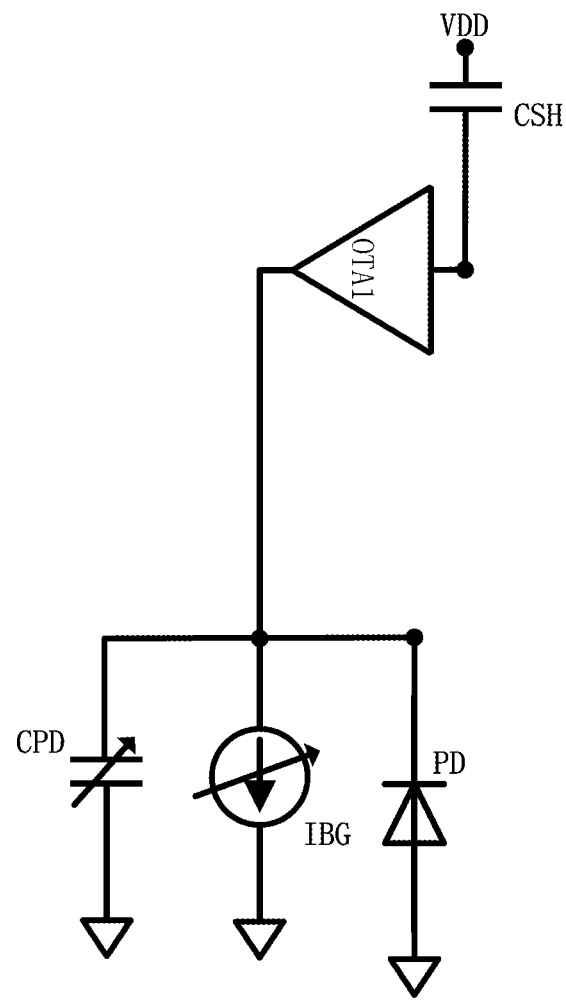
FIG. 2 is a structural schematic diagram of a current sample-and-hold circuit according to a first embodiment of this disclosure.

A first embodiment of this disclosure relates to a current sample-and-hold circuit. As shown in FIG. 2, the current sample-and-hold circuit is used for offsetting a background photocurrent of a photodiode, and includes a capacitor CSH and a first transconductance amplifier OTA1 which is used for outputting a sampled current to the photodiode to offset the background photocurrent of the photodiode. One end of the capacitor CSH is connected with a power supply VDD, and the other end of the capacitor CSH is connected with one end of the first transconductance amplifier OTA1; and the other end of the first transconductance amplifier OTA1 is connected with the photodiode PD. In FIG. 2, a current of a variable current source IBG is the background photocurrent of the photodiode PD; and a parasitic capacitance $C_{PD}$ is a parasitic capacitance of the photodiode PD.

In the embodiment, a transconductance of the first transconductance amplifier OTA1 is set to be adjustable. A working process of the current sample-and-hold circuit will be specifically illustrated below.

Specifically, the working process of the current sample-and-hold circuit includes a sampling stage and an integrating stage. In the sampling stage, a current of the first transconductance amplifier OTA1, which flows into the photodiode PD, is equal to the current of the variable current source IBG (i.e., the background photocurrent of the photodiode PD), and the capacitor CSH equivalently samples the background photocurrent and converts the background photocurrent into a voltage of the capacitor CSH. The capacitor CSH specifically may be a holding capacitor, but in practical applications, is not limited thereto.

When the background photocurrent of the photodiode PD is changed (which is caused by a change of light intensity or caused by a change of an area of the photodiode), i.e., when the current of the variable current source IBG is changed, the transconductance of the first transconductance amplifier OTA1 may be adjusted to avoid the change of the voltage U of the capacitor within a large range. According to a formula I=$g_{m1}$*U, it can be known that when the background photocurrent I of the photodiode is increased, a change of the voltage U of the capacitor within the large range can be avoided by increasing the transconductance $g_{m1}$ of the first transconductance amplifier. Therefore, even though the current sample-and-hold circuit samples a background photocurrent within a larger range, the change of the voltage U of the capacitor within the large range can also be avoided. Particularly, the transconductance gm1 of the first transconductance amplifier and the background photocurrent I of the photodiode can be changed according to a same proportion, so that the voltage U of the capacitor can be kept unchanged.

After the sampling stage ends, the integrating stage is processed. At the moment, the voltage of the capacitor CSH is converted into a current (a value of the current is equal to that of the background photocurrent sampled previously), and the current is output to the photodiode PD through the first transconductance amplifier OTA1 so as to offset the background photocurrent of the photodiode PD. The background photocurrent of the photodiode PD is equivalently offset by the previous sampled current.

Compared to existing technologies, according to the embodiment, the first transconductance amplifier with adjustable transconductance is arranged in the current sample-and-hold circuit, and according to the formula I=$g_{m1}$*U, it can be known that when the background photocurrent I of the photodiode is increased (which is caused by the change of the light intensity or caused by the change of the area of the photodiode), the change of the voltage U of the capacitor within the large range can be avoided by increasing the transconductance $g_{m1}$ of the first transconductance amplifier, and the current sample-and-hold circuit can offset the background photocurrent within the larger range.

A second embodiment of this disclosure relates to a current sample-and-hold circuit. The second embodiment is further improved based on the first embodiment, and an improvement is mainly that the second embodiment provides a bias circuit for providing a bias voltage to the first transconductance amplifier OTA1.

Figure 3:
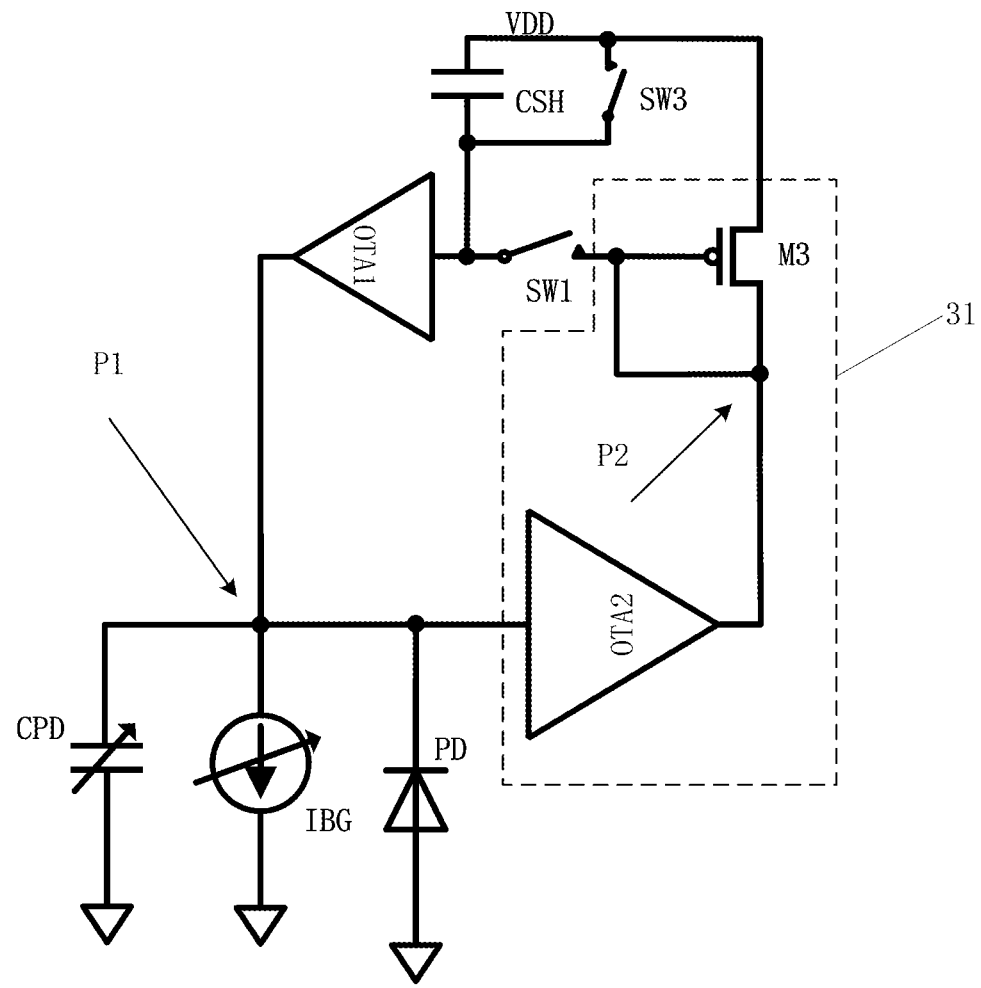
FIG. 3 is a structural schematic diagram of a current sample-and-hold circuit according to a second embodiment of this disclosure.

As shown in FIG. 3, the current sample-and-hold circuit in the embodiment further includes a first sampling switch SW1 and the bias circuit 31 for providing the bias voltage to the first transconductance amplifier OTA1. A first end of the bias circuit 31 is connected with the first sampling switch SW1, and is further connected with one end of the first transconductance amplifier OTA1 and the other end of the capacitor CSH simultaneously through the first sampling switch SW1. A second end of the bias circuit 31 is connected with the power supply VDD, and a third end of the bias circuit 31 is connected with the photodiode PD.

In practical applications, the bias circuit 31 may include a second electronic switch M3 and a second transconductance amplifier OTA2. The second electronic switch M3 may be formed by a field effect transistor or other electronic transistors, and the field effect transistor may be a PMOS transistor or a N-channel metal oxide semiconductor (NMOS) transistor. The second electronic switch in FIG. 3 is the PMOS transistor as an example, but in practical applications, the NMOS transistor may also be selected as the second electronic switch as required, and the embodiment is not limited thereto. A first end of the second electronic switch M3 (i.e., a source of the PMOS transistor in FIG. 3), as the second end of the bias circuit 31, is connected with the power supply VDD. A second end of the second electronic switch M3 (i.e., a drain of the PMOS transistor in FIG. 3) is connected with one end of the second transconductance amplifier OTA2. A control end of the second electronic switch M3 (i.e., a gate of the PMOS transistor in FIG. 3), as the first end of the bias circuit 31, is connected with the first sampling switch SW1 and a junction between the second end of the second electronic switch M3 and one end of the second transconductance amplifier OTA2. The other end of the second transconductance amplifier OTA2, as the third end of the bias circuit 31, is connected with the photodiode PD.

According to the embodiment, a third sampling switch SW3 may also be connected in parallel to the capacitor CSH, and the third sampling switch SW3 is closed before the sampling stage starts. At the moment, two ends of the capacitor CSH are connected, and the capacitor CSH is in a discharge state. This helps to eliminate charges on the capacitor CSH and ensure accuracy of sampling.

In the sampling stage, the third sampling switch SW3 may be off and the first sampling switch SW1 is closed. At the moment, a closed-loop negative feedback is formed in the entire current sample-and-hold circuit. A first end of the second transconductance amplifier OTA2 (i.e., the end for being connected with the photodiode PD) inputs a cathode voltage of the photodiode PD, and a second end of the second transconductance amplifier OTA2 (i.e., the end for being connected with the second electronic switch M3) outputs a current into the second electronic switch M3 (i.e., provides a bias current to the second electronic switch M3). When a current passes through the second electronic switch M3, a voltage may be generated so as to provide the bias voltage to the first transconductance amplifier OTA1 and trigger the first transconductance amplifier OTA1 to be in a working state. At the moment, a current of the first transconductance amplifier OTA1, which flows into the photodiode PD, is equal to a current of the variable current source IBG (i.e., the background photocurrent of the photodiode PD), and the capacitor CSH equivalently samples the background photocurrent and converts the background photocurrent into the voltage of the capacitor CSH.

Similarly, when the background photocurrent of the photodiode PD is changed (which is caused by the change of light intensity or caused by the change of the area of the photodiode), the transconductance of the first transconductance amplifier OTA1 may be adjusted to avoid the change of the voltage U of the capacitor within a large range. For example, when the background photocurrent I of the photodiode is increased, the change of the voltage U of the capacitor within a large range with increase of the background photocurrent I can be avoided by increasing the transconductance $g_{m1}$ of the first transconductance amplifier. Therefore, not only can the current sample-and-hold circuit samples the background photocurrent in a larger range, but also the voltage U of the capacitor can be avoided from changing within a large range.

After the sampling stage ends, the first sampling switch SW1 may be off, and at the moment, the circuit enters the integrating stage. As mentioned above, in the sampling stage, the current of the first transconductance amplifier OTA1, which flows into the photodiode PD, is equal to the current of the variable current source IBG (i.e., the background photocurrent of the photodiode PD), and the capacitor CSH equivalently samples the background photocurrent and converts the background photocurrent into the voltage of the capacitor CSH. In the integrating stage, the voltage of the capacitor CSH is converted into a current (a value of the current is equal to a value of the background photocurrent sampled previously), and the current is output to the photodiode PD through the first transconductance amplifier OTA1 so as to offset the background photocurrent of the photodiode PD. The background photocurrent of the photodiode PD is equivalently offset by the previous sampled current.

In addition, it is worth mentioning that in the embodiment, a loop formed by the current sample-and-hold circuit includes two poles, one pole is a dominant pole P1 (corresponding to a node between the first transconductance amplifier OTA1 and the photodiode PD), and the other pole is a non-dominant pole P2 (corresponding to a node among the control end of the second electronic switch M3, the second end of the second electronic switch M3 and the second transconductance amplifier OTA2). A position formula of the non-dominant pole P2 is that: $P2=1/(r_2*C_2)$, where $r_2$ represents an equivalent impedance of the corresponding node, and $C_2$ represents an equivalent capacitance of the corresponding node. It can be seen that a position of the pole $P_2$ is unrelated to the photodiode PD, and thus, when the area of the photodiode PD is changed, the position of the non-dominant pole is kept unchanged. A gain bandwidth product GBW of the loop is $g_{m1}*g_{m2}*r_2/C_{PD}$, where $g_{m2}$ represents a transconductance of the second transconductance amplifier OTA2, and $C_{PD}$ represents a parasitic capacitance of the photodiode PD. When the area of the photodiode PD is changed, $C_{PD}$ can also be synchronously changed (for example, when the area of the photodiode PD is increased by A times, $C_{PD}$ may also be increased by A times), and at the moment, $g_{m1}$ is changed according to an equal proportion (i.e., make $g_{m1}$ also increased by A times) by adjusting the transconductance $g_{m1}$ of the first transconductance amplifier OTA1, so that the gain bandwidth product GBW may be kept unchanged. The gain bandwidth product GBW is kept unchanged and the position of the non-dominant pole P2 is also kept unchanged, so that stability of the entire loop is not influenced by the change of the area of the photodiode PD.

Compared to the first embodiment, according to the embodiment, when the background photocurrent I of the photodiode PD is increased (which is caused by the change of the light intensity or caused by the change of the area of the photodiode), the change of the voltage U of the capacitor within the large range with increase of the background photocurrent I can be avoided by increasing the transconductance gm1 of the first transconductance amplifier, and the background photocurrent changing within a larger range can be offset by the current sample-and-hold circuit. Meanwhile, when the area of the photodiode PD is changed, the transconductance $g_{m1}$ of the first transconductance amplifier is changed in the same proportion as the area of the photodiode PD is changed by adjusting the transconductance $g_{m1}$ of the first transconductance amplifier, so that stability of the entire circuit is not influenced by the change of the area of the photodiode PD.

A third embodiment of this disclosure relates to a current sample-and-hold circuit. The third embodiment provides an implementation of the first transconductance amplifier and the second transconductance amplifier based on the second embodiment.

Figure 4:
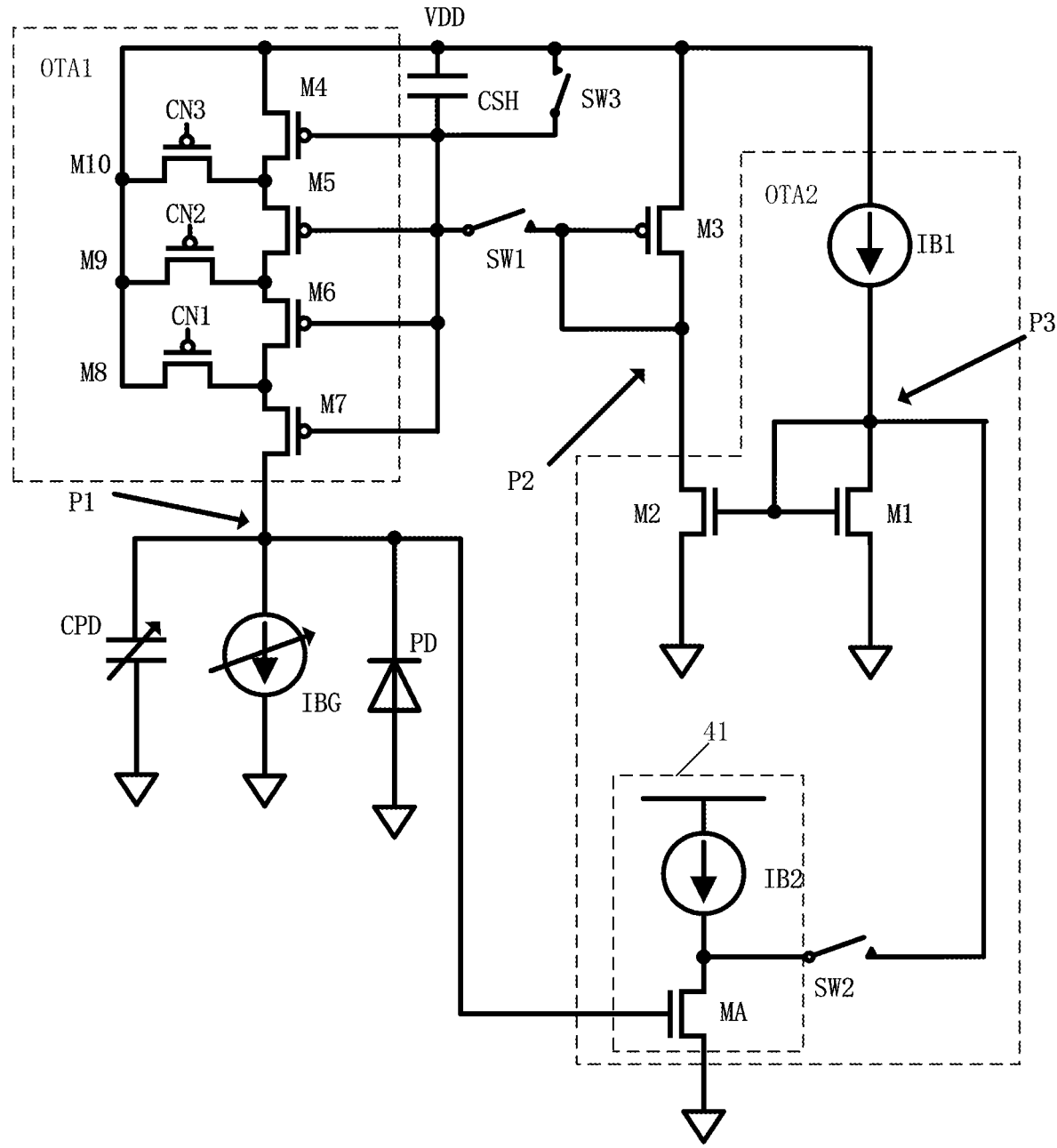
FIG. 4 is a structural schematic diagram of a current sample-and-hold circuit according to a third embodiment of this disclosure.

As shown in FIG. 4, the first transconductance amplifier OTA1 may include a plurality of first electronic switches and a plurality of control switches for controlling the first electronic switches. The plurality of first electronic switches are connected between the power supply VDD and the photodiode PD, the plurality of first electronic switches are connected in series, and control ends of the plurality of first electronic switches are all connected with the other end of the capacitor CSH. Moreover, a junction between any two adjacent first electronic switches corresponds to one control switch, one end of each control switch is connected with the power supply VDD, and the other end of each control switch is connected with the corresponding junction.

Specifically, the first electronic switch may be formed by a field effect transistor or other electronic transistors, and the field effect transistor may be a PMOS transistor or a NMOS transistor. FIG. 4 illustrates that the first electronic switch is the PMOS transistor and the number of the first electronic switches is equal to 4. Four first electronic switches in FIG. 4 are respectively a PMOS transistor M4, a PMOS transistor M5, a PMOS transistor M6 and a PMOS transistor M7 which are sequentially connected. A source of the PMOS transistor M4, as one end of the first transconductance amplifier OTA1, is connected to the capacitor CSH; and a drain of the PMOS transistor M4 is connected with a source of the PMOS transistor M5, a drain of the PMOS transistor M5 is connected with a source of the PMOS transistor M6, a drain of the PMOS transistor M6 is connected with a source of the PMOS transistor M7, and a drain electrode of the PMOS transistor M7, as the other end of the first transconductance amplifier OTA1, is connected with the photodiode PD. Gates of the PMOS transistor M4, PMOS transistor M5, PMOS transistor M6 and PMOS transistor M7 are all connected with the other end of the capacitor CSH.

The control switch may be an electronic switch or a common mechanical switch, and the electronic switch may be a field effect transistor, e.g., a PMOS transistor or a NMOS transistor. FIG. 4 illustrates that the control switch is the PMOS transistor and the number of the control switches is equal to 3. Three control switches in FIG. 4 are respectively a M8 (i.e., CN1), a M9 (i.e., CN2) and a M10 (i.e., CN3). A junction corresponding to the control switch M8 is a junction between the PMOS transistor M6 and the PMOS transistor M7, a junction corresponding to the control switch M9 is a junction between the PMOS transistor M5 and the PMOS transistor M6, and a junction corresponding to the control switch M10 is a junction between the PMOS transistor M4 and the PMOS transistor M5. It is worth mentioning that when the PMOS transistor or the NMOS transistor is selected as the control switch, a gate of the PMOS transistor or the NMOS transistor may be float, and a source and a drain thereof are used as two connecting terminals of the control switch. In the embodiment, the PMOS transistor is preferably selected as the control switch as compared with the NMOS transistor, because a substrate of the PMOS transistor is short connected with the source, thus the PMOS transistor has no substrate bias effect and has a better conduction characteristic.

It should be noted that the embodiment merely illustrates that the number of the first electronic switches is 4 and the number of the control switches is 3. In practical applications, the number of the first electronic switches may also be flexibly selected according to the actual situation, the number of the control switches is adaptively adjusted according to the number of the first electronic switches, and the embodiment is not limited thereto.

The second transconductance amplifier OTA2 may include a second sampling switch SW2, an amplification circuit 41, a first current source IB1, a third electronic switch M2 and a fourth electronic switch M1. The third electronic switch M2 and the fourth electronic switch M1 may be formed by field effect transistors or other electronic transistors, and the field effect transistors may be PMOS transistors or NMOS transistors. FIG. 4 illustrates that both the third electronic switch M2 and the fourth electronic switch M1 are NMOS transistors. A first end of the third electronic switch M2 (i.e., a drain of the NMOS transistor M2 in FIG. 4) is connected with a second end of the second electronic switch M3. A second end of the third electronic switch M2 (i.e., a source of the NMOS transistor M2 in FIG. 4) is grounded. A control end of the third electronic switch M2 (i.e., a gate of the NMOS transistor M2 in FIG. 4) is connected with a junction between a second end of the first current source IB1 and a first end of the fourth electronic switch M1 (i.e., a drain of the NMOS transistor M1 in FIG. 4) as well as a control end of the fourth electronic switch M1 (i.e., a gate of the NMOS transistor M1 in FIG. 4). A second end of the fourth electronic switch M1 (i.e., a source electrode of the NMOS transistor M1 in FIG. 4) is grounded. A first end of the first current source IB1 is connected with the power supply VDD. The first end of the fourth electronic switch M1 is also connected with one end of the amplification circuit 41 through the second sampling switch SW2; and the other end of the amplification circuit 41 is connected with the photodiode PD.

In the embodiment, the amplification circuit 41 may be an amplification circuit in the integrator, which is beneficial for implementing multiplexing on the amplification circuit. The amplification circuit 41 may include a second current source IB2 and a fifth electronic switch MA. The fifth electronic switch MA may be formed by a field effect transistor or other electronic transistors, and the field effect transistor may be a PMOS transistor or an NMOS transistor. FIG. 4 illustrates that the fifth electronic switch MA is the NMOS transistor. A first end of the fifth electronic switch MA (i.e., a drain of the NMOS transistor MA in FIG. 4), as one end of the amplification circuit 41, is respectively connected with the second current source IB2 and the second sampling switch SW2; a second end of the fifth electronic switch MA (i.e., a source of the NMOS transistor MA in FIG. 4) is grounded; and a control end of the fifth electronic switch MA (i.e., a gate of the NMOS transistor MA in FIG. 4), as the other end of the amplification circuit 41, is connected with the photodiode PD.

When the plurality of first electronic switches in the first transconductance amplifier OTA1 are all field effect transistors, an equivalent width-to-length ratio of conductive field effect transistors and an equivalent output impedance of conductive field effect transistors may be adjusted by controlling the number of conductive field effect transistors, so that an objective to adjust a transconductance of the first transconductance amplifier OTA1 is fulfilled, a larger background photocurrent can be offset by the current sample-and-hold circuit in the premise of avoiding the voltage U of the capacitor from changing within a large range, and stability of the current sample-and-hold circuit is not influenced by the change of the area of the photodiode PD.

The following illustrates that the plurality of first electronic switches are all PMOS transistors. Specifically, when the plurality of first electronic switches are all the PMOS transistors, width-to-length ratios of the plurality of PMOS transistors should meet a relationship that: when the plurality of PMOS transistors are sequentially arranged towards the photodiode PD, a first PMOS transistor refers to a PMOS transistor the closest to the photodiode PD, and a last PMOS transistor refers to a PMOS transistor the furthest away from the photodiode PD. A width-to-length ratio of the first PMOS transistor is equal to that of a second PMOS transistor, and a width-to-length ratio of an $i^{th}$ PMOS transistor is twice of a width-to-length ratio of a $(i-1)^{th}$ PMOS transistor, wherein the i is greater than or equal to 3. When the second electronic switch M3 is also a PMOS transistor, a width-to-length ratio of the second electronic switch M3 may be equal to that of the first PMOS transistor. Namely, a width-to-length ratio of the PMOS transistor M7 is equal to that of the PMOS transistor M6, i.e., $(W/L)_{M7}=(W/L)_{M6}$; a width-to-length ratio of the PMOS transistor M5 is twice of that of the PMOS transistor M6, i.e., $(W/L)_{M5}=2(W/L)_{M6}$; a width-to-length ratio of the PMOS transistor M4 is twice of that of the PMOS transistor M5, i.e., $(W/L)_{M4}=2(W/L)_{M5}$; and a width-to-length ratio of the second electronic switch M3 is equal to that of the PMOS transistor M7, i.e., $(W/L)_{M3}=(W/L)_{M7}$.

It is worth mentioning that in the practical application, one or more PMOS transistors may further be connected in series between the PMOS transistor M4 and the power supply VDD (the number of the PMOS transistors connected in series can be determined according to the actual situation), in order to cover a larger range of the background photocurrent (i.e., cover a larger change range of the area of the photodiode). For example, when one PMOS transistor is further connected in series between the PMOS transistor M4 and the power supply VDD, a width-to-length ratio of this PMOS transistor should be twice of that of the PMOS transistor M4.

In the sampling stage, the third sampling switch SW3 is off, and the first sampling switch SW1 and the second sampling switch SW2 are closed. At the moment, a closed-loop negative feedback is formed in the current sample-and-hold circuit. The first current source IB1 and the second current source IB2 provide currents to the fourth electronic switch M1, and a voltage is generated on the fourth electronic switch M1, so that a bias voltage is provided to the third electronic switch M2. After receiving the bias voltage, the third electronic switch M2 generates a current so as to provide a bias current to the second electronic switch M3. After receiving the bias current, the second electronic switch M3 generates a voltage so as to provide a bias voltage to the gates of the PMOS transistor M4, the PMOS transistor M5, the PMOS transistor M6 and the PMOS transistor M7 (i.e., provide the bias voltage to the plurality of first electronic switches) and trigger the PMOS transistor M4, the PMOS transistor M5, the PMOS transistor M6 and the PMOS transistor M7 to be in a working state. At the moment, a current flowing into the photodiode PD through the PMOS transistor M4, the PMOS transistor M5, the PMOS transistor M6 and the PMOS transistor M7 is equal to that of a variable current source IBG (i.e., the background photocurrent), and the capacitor CSH equivalently samples the background photocurrent and converts the background photocurrent into a voltage of the capacitor CSH.

In a case where light intensity is unchanged, when the area of the photodiode PD is minimum, the background photocurrent is also minimum. At the moment, the control switches M8, M9 and M10 may be off, so that the PMOS transistor M4, the PMOS transistor M5, the PMOS transistor M6 and the PMOS transistor M7 are all conductive. At the moment, the equivalent width-to-length ratio of the PMOS transistor M4, the PMOS transistor M5, the PMOS transistor M6 and the PMOS transistor M7 is W/(8L), and the width-to-length ratio of the second electronic switch M3 is W/L, i.e., the width-to-length ratio of the second electronic switch M3 is eight times of the width-to-length ratio of the conductive PMOS transistor M4, PMOS transistor M5, PMOS transistor M6 and PMOS transistor M7. Therefore, a current $I_{M3}$ flowing through the second electronic switch M3 is eight times of a current $I_{BG}$ of the variable current source IBG (i.e., the background photocurrent) currently, i.e., $I_{M3}=8I_{BG}$. When the area of the photodiode PD is doubled, the current of the variable current source IBG is also changed into $2I_{BG}$.

At the moment, the control switches M8 and M9 may be off, and the control switch M10 is on, so that the PMOS transistor M4 is short-circuited. At the moment, the PMOS transistor M5, the PMOS transistor M6 and the PMOS transistor M7 are conductive, the equivalent width-to-length ratio of the PMOS transistor M5, the PMOS transistor M6 and the PMOS transistor M7 is W/(4L), the width-to-length ratio of the second electronic switch M3 is four times of the width-to-length ratio of the conductive PMOS transistor M5, PMOS transistor M6 and PMOS transistor M7, and the current $I_{M3}$ flowing through the second electronic switch M3 is four times of a current of the variable current source IBG $2I_{BG}$ currently, i.e., $I_{M3}=8I_{BG}$. Similarly, when the area of the photodiode PD is changed into four times of the original area, the current of the variable current source IBG is also changed into $4I_{BG}$, the control switches M8 and M10 may be off and the control switch M9 is on, so that the PMOS transistor M4 and the PMOS transistor M5 are short-circuited. At the moment, the PMOS transistor M6 and the PMOS transistor M7 are conductive, and the equivalent width-to-length ratio of the PMOS transistor M6 and the PMOS transistor M7 is W/(2L). The width-to-length ratio of the second electronic switch M3 is twice of the equivalent width-to-length ratio of the conductive PMOS transistor M6 and PMOS transistor M7, and the current flowing through the second electronic switch M3 $I_{M3}$ is twice of a current of the variable current source IBG $4I_{BG}$ currently, i.e., $I_{M3}=8I_{BG}$. Thus, it can be seen that no matter how the area of the photodiode PD is changed, the current $I_{M3}$ flowing through the second electronic switch M3 may be always unchanged, by changing the number of the conductive PMOS transistors by controlling on and off of the plurality of control switches and adjusting the equivalent width-to-length ratio of the conductive PMOS transistors.

In one aspect, a formula is that $I=(1/2)*uc_{ox}*(W/L)*(V_{GS}-V_{TH})$, wherein I represents the background photocurrent of the photodiode PD, i.e., the current of the variable current source IBG $I_{BG}$; $uc_{ox}$ is a constant parameter; (W/L) herein represents the equivalent width-to-length ratio of the conductive PMOS transistors; $V_{GS}$ represents a gate-to-source voltage of the plurality of PMOS transistors, and is equal to the voltage U of the capacitor CSH; and $V_{TH}$ represents a threshold voltage of the plurality of PMOS transistors, and is not influenced by the change of the area of the photodiode PD. It can be known from the above formula that: when the area of the photodiode PD is changed, I can be changed with accordingly. In this case, the equivalent width-to-length ratio (W/L) of the conductive PMOS transistors is also changed by changing the number of the conductive PMOS transistors, so that the change of the voltage of the capacitor CSH within a large range can be avoided. Specially, if the equivalent width-to-length ratio (W/L) is changed in the same proportion as the current I is changed, the $V_{GS}$ may be kept unchanged, i.e., the voltage of the capacitor CSH is kept unchanged.

In another aspect, when the area of the photodiode is changed, the current $I_{M3}$ flowing through the second electronic switch M3 is always unchanged by adjusting the equivalent width-to-length ratio of the conductive PMOS transistors, so that the position of the non-dominant pole P2 in the circuit may be kept unchanged. A current in the circuit, which flows through the fourth electronic switch M1, is provided by the first current source IB1 and the second current source IB2; due to that both the first current source IB1 and the second current source IB2 are constant current sources, the current $I_{M1}$ flowing through the fourth electronic switch M1 also may not be changed. Since $I_{M1}$ is unchanged, a position of a non-dominant pole P3 (corresponding to a node among the second end of the first current source IB1 and the first end of the fourth electronic switch M1 and the control end of the fourth electronic switch M1) in the circuit also is changed. In other words, the positions of both the non-dominant poles P2 and P3 in the circuit are not changed. A formula about a gain bandwidth product of the circuit is that $GBW=g_{mA}*K/C_{PD}$, wherein $C_{PD}$ represents a parasitic capacitance of the photodiode, and K represents a ratio of the equivalent width-to-length ratio of the conductive PMOS transistors to the width-to-length ratio of the second electronic switch M3; and $g_{mA}$ represents a transconductance of the amplification circuit 41, and is not influenced by the change of the photodiode PD. As mentioned above, when the area of the photodiode PD is doubled, $C_{PD}$ may also be doubled. In this case, the PMOS transistor M4 is short-circuited, the PMOS transistor M5, the PMOS transistor M6 and the PMOS transistor M7 are conductive, and an equivalent channel length of the PMOS transistor M5, the PMOS transistor M6 and the PMOS transistor M7 is reduced by 50%, so that the ratio K of the equivalent width-to-length ratio of the conductive PMOS transistors to the width-to-length ratio of the second electronic switch M3 is also changed to be twice of the original ratio, and GBW is kept unchanged. Similarly, when the area of the photodiode PD is increased by four times, $C_{PD}$ may also be increased by four times. In this case, the PMOS transistor M4 and the PMOS transistor M5 are short-circuited, the PMOS transistor M6 and the PMOS transistor M7 are conductive. The ratio K of the equivalent width-to-length ratio of the conductive PMOS transistors to the width-to-length ratio of the second electronic switch M3 is also changed to be four times of the original ratio, and GBW is still kept unchanged. Thus it can be seen that when the area of the photodiode PD is changed, the equivalent channel length of the conductive PMOS transistors can be changed in a reversed proportion to the change of the area of the photodiode PD by changing the number of the conductive PMOS transistors (i.e., the equivalent output impedance is in a direct proportion to the equivalent channel length, and thus herein, the equivalent output impedance of the conductive PMOS transistors may also be changed in the reversed proportion to the change of the area of the photodiode), so that the gain bandwidth product of the loop is constant. The positions of the two non-dominant poles P2 and P3 in the loop are kept unchanged, and the gain bandwidth product of the loop is also constant, so that stability of the loop may be not influenced by the change of the area of the photodiode PD.

It should be noted that in actual designs, the minimum width-to-length ratio (e.g., the width-to-length ratio of the PMOS transistor M7) may be designed according to the minimum area of the photodiode PD. Moreover, at design time, a certain margin is reserved. For example, a gear with 1 time of area (i.e., the area of the photodiode PD is doubled) is enough for supporting the case where the area of the photodiode PD is changed in a range between 0.5 time and 1.5 times; a gear with 2 times of area (i.e., the area of the photodiode PD is increased by twice) is enough for supporting the case where the area of the photodiode PD is changed in a range between 1.5 times and 2.5 times.

When the sampling stage ends, the first sampling switch SW1 and the second sampling switch SW2 may be off, and at the moment, the circuit enters into the integrating stage. The voltage of the capacitor CSH is converted into the current (the value of the current is equal to the value of the background photocurrent sampled previously), and the current is output to the photodiode PD through the conductive PMOS transistors so as to offset the background photocurrent of the photodiode PD.

It is worth mentioning that the embodiment provides the implementation of the first transconductance amplifier OTA1 and the second transconductance amplifier OTA2. But in the practical application, conventional operational transconductance amplifiers may also be directly selected as the first transconductance amplifier OTA1 and the second transconductance amplifier OTA2, and the embodiment is limited thereto.

A fourth embodiment of this disclosure relates to a sensor. The sensor may be a sensor for detecting a heart rate, and specifically, the sensor may be integrated with the current sample-and-hold circuit as provided by the first embodiment, the second embodiment or the third embodiment, together with a photodiode. The other end of the first transconductance amplifier OTA1 of the current sample-and-hold circuit may be connected with a cathode of the photodiode, and an anode of the photodiode may be grounded.

In addition, alternatively, the sensor may also be integrated with an integrator, and an amplification circuit of the integrator is used as the amplification circuit of the bias circuit in the second embodiment. Therefore, in a sampling stage, the first sampling switch SW1 is closed, and the amplification circuit of the integrator, as one part of the current sample-and-hold circuit, forms a loop with other parts of the current sample-and-hold circuit. In an integrating stage, after the first sampling switch SW1 is off, the amplification circuit works as one part of the integrator. It is beneficial for implementing multiplexing on the amplification circuit of the integrator.

Those skilled in the art can understand that each of the above-mentioned embodiments is the specific embodiment for implementing this disclosure, but in the practical application, various changes can be made to the embodiments in form and in detail, without departing from the spirit and scope of this disclosure.

What is claimed is:

1. A current sample-and-hold circuit for offsetting a background photocurrent of a photodiode, comprising: a capacitor and a first transconductance amplifier which has adjustable transconductance;
    one end of the capacitor being connected with a power supply VDD, and the other end of the capacitor being connected with one end of the first transconductance amplifier; and the other end of the first transconductance amplifier being connected with the photodiode to output the sampled current to the photodiode;
    wherein, the capacitor is a holding capacitor configured to:
    sample the background photocurrent and convert the background photocurrent into a voltage of the capacitor, when the current sample-and-hold circuit is in a sampling stage; wherein, when the background photocurrent of the photodiode is changed, the transconductance of the first transconductance amplifier is adjustable;
    convert the voltage of the capacitor into a current and output the current to the photodiode through the first transconductance amplifier to offset the background photocurrent of the photodiode, when the current sample-and-hold circuit is in an integrating stage.

2. The current sample-and-hold circuit according to claim 1, wherein the first transconductance amplifier comprises a plurality of first electronic switches and a plurality of control switches for controlling the first electronic switches;
    the plurality of first electronic switches are connected between the power supply VDD and the photodiode, the plurality of first electronic switches are connected in series, and control ends of the plurality of first electronic switches are all connected with the other end of the capacitor; and
    a junction between any two adjacent first electronic switches corresponds to one control switch, one end of each control switch is connected with the power supply VDD, and the other end of each control switch is connected with a corresponding junction.

3. The current sample-and-hold circuit according to claim 1, further comprising a first sampling switch and a bias circuit for providing a bias voltage to the first transconductance amplifier;
    a first end of the bias circuit being simultaneously connected with one end of the first transconductance amplifier and the other end of the capacitor through the first sampling switch; a second end of the bias circuit being connected with the power supply VDD; and a third end of the bias circuit being connected with the photodiode.

4. The current sample-and-hold circuit according to claim 3, wherein the bias circuit comprises a second electronic switch and a second transconductance amplifier;
    a first end of the second electronic switch, as the second end of the bias circuit, is connected with the power supply VDD; a second end of the second electronic switch is connected with one end of the second transconductance amplifier; a control end of the second electronic switch, as the first end of the bias circuit, is connected with the first sampling switch as well as a junction between the second end of the second electronic switch and one end of the second transconductance amplifier; and the other end of the second transconductance amplifier, as the third end of the bias circuit, is connected with the photodiode.

5. The current sample-and-hold circuit according to claim 4, wherein the second transconductance amplifier comprises a second sampling switch, an amplification circuit, a first current source, a third electronic switch and a fourth electronic switch;
    a first end of the third electronic switch is connected with the second end of the second electronic switch; a second end of the third electronic switch is grounded; a control end of the third electronic switch is connected with a junction between a second end of the first current source and a first end of the fourth electronic switch as well as a control end of the fourth electronic switch; a first end of the first current source is connected with the power supply VDD;
    the first end of the fourth electronic switch is also connected with one end of the amplification circuit through the second sampling switch; a second end of the fourth electronic switch is grounded; and the other end of the amplification circuit is connected with the photodiode.

6. The current sample-and-hold circuit according to claim 5, wherein the amplification circuit comprises a second current source and a fifth electronic switch;
    a first end of the fifth electronic switch, as one end of the amplification circuit, is respectively connected with the second current source and the second sampling switch; a second end of the fifth electronic switch is grounded;

and a control end of the fifth electronic switch, as the other end of the amplification circuit, is connected with the photodiode.

7. The current sample-and-hold circuit according to claim 4, wherein the first electronic switches comprise PMOS transistors; a plurality of PMOS transistors are sequentially arranged towards the photodiode;

a first PMOS transistor of the plurality of PMOS transistors refers to a PMOS transistor the closest to the photodiode, and a last PMOS transistor refers to a PMOS transistor the furthest away from the photodiode; a width-to-length ratio of the first PMOS transistor is equal to that of a second PMOS transistor, a width-to-length ratio of an $i^{th}$ PMOS transistor is twice of a width-to-length ratio of a $(i-1)^{th}$ PMOS transistor, and the i is greater than or equal to 3.

8. The current sample-and-hold circuit according to claim 7, wherein the second electronic switch is a PMOS transistor, and a width-to-length ratio of the second electronic switch is equal to that of the first PMOS transistor.

9. The current sample-and-hold circuit according to claim 1, further comprising a third sampling switch; the third sampling switch being connected in parallel to the capacitor.

10. A sensor, comprising a photodiode and a current sample-and-hold circuit for offsetting a background photocurrent of the photodiode, comprising: a capacitor and a first transconductance amplifier which has adjustable transconductance; one end of the capacitor being connected with a power supply VDD, and the other end of the capacitor being connected with one end of the first transconductance amplifier; and the other end of the first transconductance amplifier being connected with the photodiode to output the sampled current to the photodiode;

wherein, the capacitor is a holding capacitor configured to:

sample the background photocurrent and convert the background photocurrent into a voltage of the capacitor, when the current sample-and-hold circuit is in a sampling stage; wherein, when the background photocurrent of the photodiode is changed, the transconductance of the first transconductance amplifier is adjustable;

convert the voltage of the capacitor into a current and output the current to the photodiode through the first transconductance amplifier to offset the background photocurrent of the photodiode, when the current sample-and-hold circuit is in an integrating stage.

* * * * *